United States Patent
Park et al.

(10) Patent No.: US 7,741,223 B2
(45) Date of Patent: Jun. 22, 2010

(54) SEMICONDUCTOR DEVICE WITH BULB TYPE RECESS GATE AND METHOD FOR FABRICATING THE SAME

(75) Inventors: Hyun-Sik Park, Ichon-shi (KR); Ky-Hyun Han, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 489 days.

(21) Appl. No.: 11/768,366

(22) Filed: Jun. 26, 2007

(65) Prior Publication Data

US 2008/0128799 A1    Jun. 5, 2008

(30) Foreign Application Priority Data

Dec. 1, 2006    (KR)    ............. 10-2006-0120388

(51) Int. Cl.
*H01L 21/311*    (2006.01)
(52) U.S. Cl. ............ 438/700; 438/701; 438/637; 438/638; 438/340; 438/270; 438/277; 438/259; 257/296; 257/E29.2; 257/E29.201; 257/E21.545; 257/E21.549
(58) Field of Classification Search ............ 438/700, 438/701, 637, 638, 640, 270, 277, 259; 257/296, 257/E29.2, E29.201, E21.545, E21.549
See application file for complete search history.

(56) References Cited

U.S. PATENT DOCUMENTS

| | | | | |
|---|---|---|---|---|
| 5,891,807 A | * | 4/1999 | Muller et al. | 438/713 |
| 6,605,838 B1 | * | 8/2003 | Mandelman et al. | 257/305 |
| 7,582,532 B2 | * | 9/2009 | Han et al. | 438/270 |
| 2006/0237817 A1 | * | 10/2006 | Park | 257/500 |
| 2007/0155101 A1 | * | 7/2007 | Lee et al. | 438/259 |
| 2007/0281455 A1 | * | 12/2007 | Kim | 438/589 |
| 2008/0023753 A1 | * | 1/2008 | Choi et al. | 257/327 |
| 2008/0079068 A1 | * | 4/2008 | Kim | 257/330 |
| 2008/0081421 A1 | * | 4/2008 | Lim et al. | 438/270 |
| 2008/0160699 A1 | * | 7/2008 | Lee et al. | 438/270 |
| 2009/0114999 A1 | * | 5/2009 | Seo et al. | 257/403 |

FOREIGN PATENT DOCUMENTS

KR    1020030032118    4/2003

* cited by examiner

*Primary Examiner*—Mary Wilczewski
*Assistant Examiner*—Telly D Green
(74) *Attorney, Agent, or Firm*—Lowe Hauptman Ham & Berner LLP

(57) ABSTRACT

A method for fabricating a semiconductor device includes etching a substrate to form a first recess having a micro trench, etching the substrate disposed under the first recess to form a second recess having a profile substantially vertical and a width greater than a portion of the first recess where no micro trench is formed, etching the substrate disposed under the second recess to form a third recess having a profile substantially spherical, and forming a gate pattern over a resultant recess including the first to third recesses.

16 Claims, 7 Drawing Sheets

SEMICONDUCTOR DEVICE WITH BULB TYPE RECESS GATE AND METHOD FOR FABRICATING THE SAME

CROSS-REFERENCE TO RELATED APPLICATIONS

The present invention claims priority of Korean patent application number 10-2006-0120388, filed on Dec. 1, 2006, which is incorporated by reference in its entirety.

BACKGROUND OF THE INVENTION

The present invention relates to a fabrication technology of a semiconductor device, and more particularly, to a semiconductor device with a bulb type recess gate and a method for fabricating the same.

As semiconductor devices are highly integrated, a portion of an active region is etched to form a recess in a semiconductor substrate and a gate is formed on the recess. The process of forming the recess gate is important for the fabrication of the semiconductor devices. Compared with a typical planar gate structure, the recess gate has a longer gate length and a wider channel area. Therefore, the formation of the recess gate can improve electrical characteristics of the semiconductor device, such as a threshold voltage and a refresh time.

However, as semiconductor devices are scaled down, patterns become finer and a gap between components is reduced. Hence, there is a need for a technology that can further increase a channel area. As one example, a process of forming a bulb type recess gate is proposed which can increase a channel area by increasing an area of a lower portion of a recess. More specifically, the bulb type recess includes a neck pattern and a bulb pattern. The neck pattern is formed by etching a semiconductor substrate using a hard mask pattern as an etching mask. The hard mask pattern opens a region where a recess is formed. The bulb pattern is formed by forming spacer insulating layers on sidewalls of the neck pattern and isotropically etching the semiconductor substrate under the neck pattern.

FIG. 1 is a sectional view of a profile of a typical recess and a bulb type recess. Referring to FIG. 1, a lower portion of a bulb type recess shown on the right side of FIG. 1 is a bulb pattern having a spherical shape. Therefore, compared with a typical recess shown on the left side of FIG. 1, the bulb type recess can secure a wider channel area. As the bulb pattern is larger, the channel area can be further widened.

However, a void is formed when a polysilicon electrode for a gate pattern is deposited on the bulb type recess. This result is because the neck pattern disposed at an upper portion of the recess is narrower than the bulb pattern disposed at a lower portion of the recess. Thus, the neck pattern is first filled with the polysilicon before the bulb pattern is completely filled. In case where the size of the void is small, the void does not greatly affect the characteristics of the device (see FIG. 2A). However, as the bulb pattern is larger compared with the neck pattern in the bulb type recess, the size of the void increases (see FIG. 2B) The increase in the size of the void may badly affect the electrical characteristics of the device.

On the other hand, when a large neck pattern is formed considering the size of the bulb pattern, the size of the void can be reduced. However, an overlay margin with respect to the gate pattern formed on the recess is reduced. Thus, a misalignment may occur so that an upper portion of the bulb type recess is exposed out of the gate pattern (see FIG. 3). This misalignment may have a bad effect on the electrical characteristics of the device.

Therefore, there is a need for a technique that can reduce the size of the void, while maintaining the size of the bulb pattern and the overlay margin with respect to the gate pattern formed on the recess.

SUMMARY OF THE INVENTION

Embodiments of the present invention are directed toward providing a semiconductor device having a bulb type recess gate and a method for fabricating the same. The semiconductor device can reduce a size of a void while maintaining a size of a bulb pattern and an overlay margin with respect to a gate pattern formed on a recess, thereby improving electrical characteristics of the device.

In accordance with one embodiment of the present invention, there is provided a method for fabricating a semiconductor device. The method includes etching a substrate to form a first recess having a micro trench, etching the substrate disposed under the first recess to form a second recess having a profile substantially vertical and a width greater than a portion of the first recess where no micro trench is formed, etching the substrate disposed under the second recess to form a third recess having a profile substantially spherical, and forming a gate pattern over a resultant recess including the first to third recesses.

In accordance with another embodiment of the present invention, there is provided a semiconductor device. The semiconductor device includes a first recess having a substantially vertical profile at an upper sidewall portion, a second recess extending from a lower portion of the first recess and having a width greater than the first recess and a profile substantially vertical at a sidewall portion, a third recess extending from a lower portion of the second recess and having a width greater than the second recess and a profile substantially spherical, and a gate pattern filled in the first to third recesses.

DESCRIPTION OF SPECIFIC EMBODIMENTS

FIGS. 4A to 4E are sectional views illustrating a method for fabricating a semiconductor memory in accordance with an embodiment of the present invention.

Figure 1:
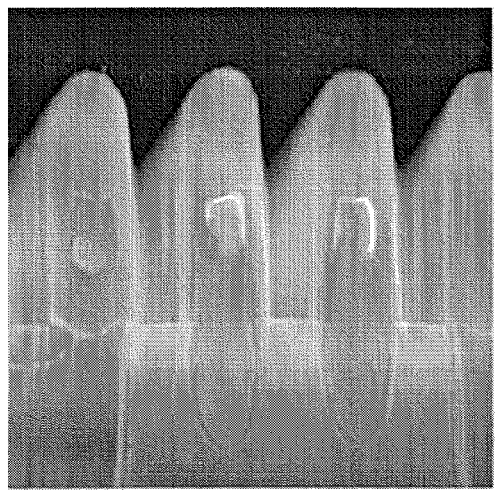
FIG. 1 illustrates a sectional view of a profile of a typical recess and a bulb type recess.
Figure 1:
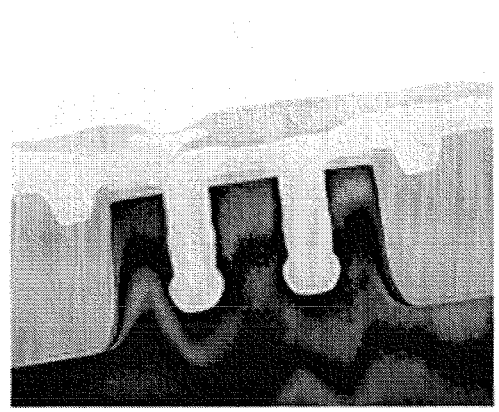
Figure 2A:
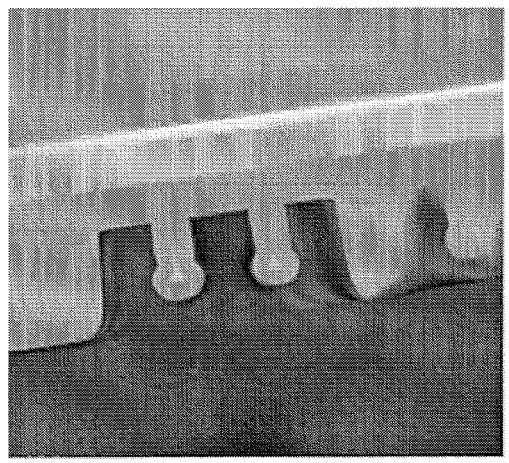
FIGS. 2A and 2B illustrate sectional views of voids formed on a bulb type recess during deposition of a polysilicon electrode.
Figure 2A:
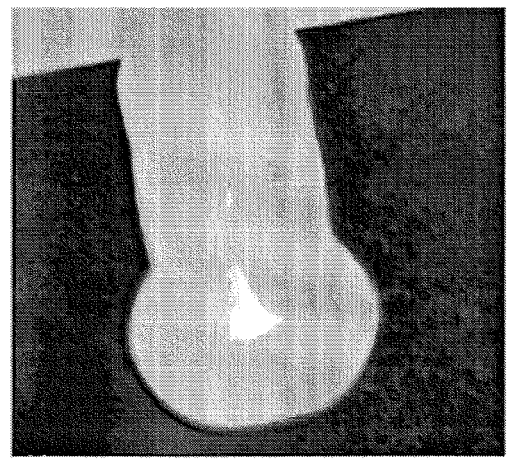
Figure 2B:
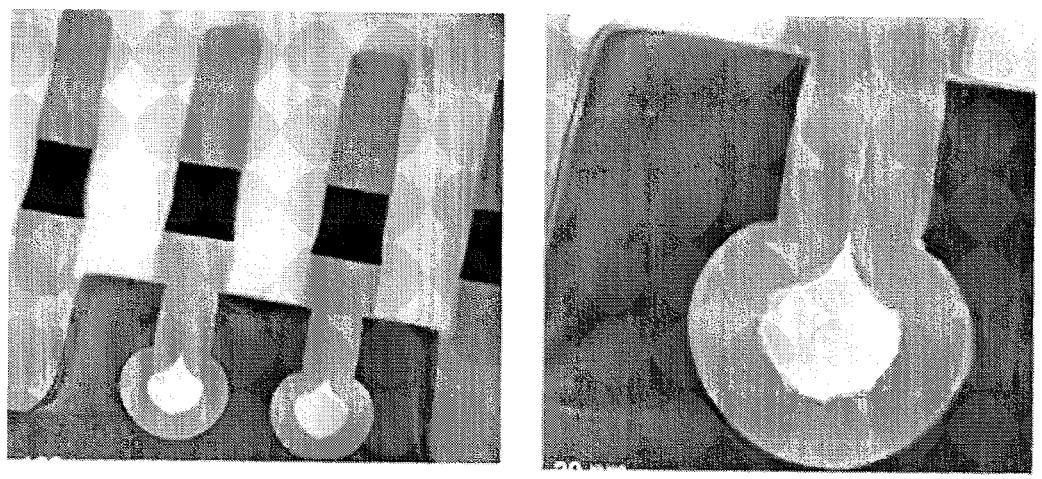
Figure 3:
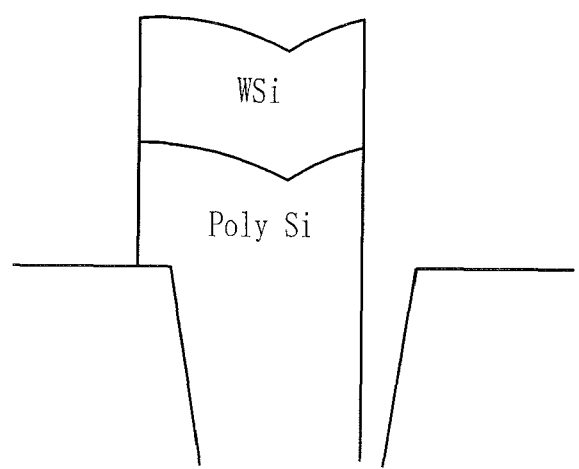
FIG. 3 illustrates a sectional view of a misalignment occurring in a bulb type recess during deposition of a polysilicon electrode.
Figure 4A:
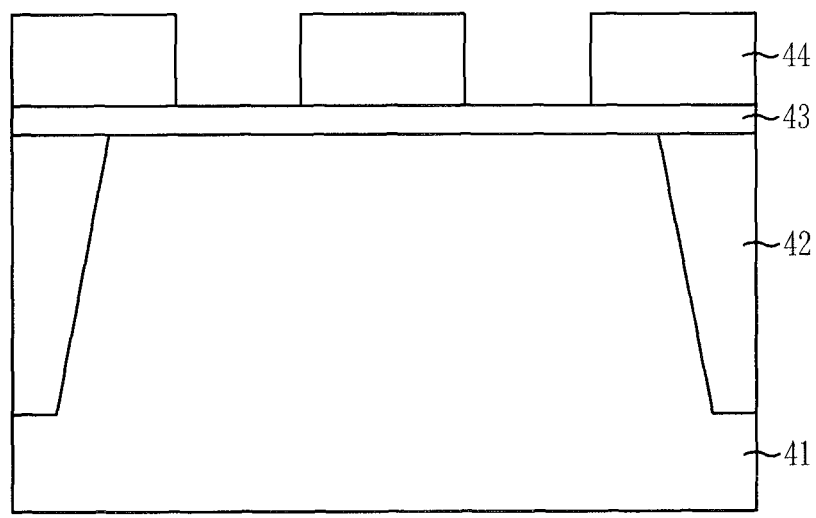
FIGS. 4A to 4E are sectional views illustrating a method for fabricating a semiconductor device in accordance with an embodiment of the present invention.

Referring to FIG. 4A, an isolation structure 42 is formed in a substrate 41 (e.g., semiconductor substrate) to define an active region. Specifically, a portion of the substrate 41 is etched to form a trench, and the trench is filled with an insulating layer. Then, a chemical mechanical polishing (CMP) process is performed to form the isolation structure 42 in the substrate 41. A sacrificial oxide layer 43 is formed on the substrate 41.

A hard mask pattern 44 opening a recess region is formed on the sacrificial oxide layer 43. Specifically, a hard mask layer is formed on the sacrificial oxide layer 43, and a photoresist pattern defining the recess region is formed on the hard mask layer. Thereafter, the hard mask layer is etched using the photoresist pattern as a mask, thereby forming the hard mask pattern 44. The hard mask layer serves as an etch barrier during a subsequent process of forming a recess, and may include polysilicon.

Figure 4B:
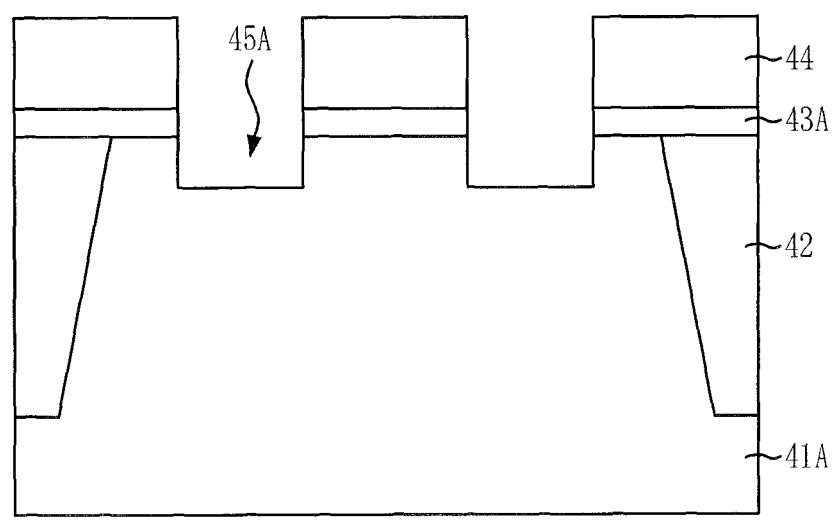

Referring to FIG. 4B, the sacrificial oxide layer 43 is etched using the hard mask pattern 44 as a mask. Reference numerals 43A and 41A represent a patterned sacrificial oxide layer and a first patterned substrate, respectively. Then, the substrate 41 is etched using the hard mask pattern 44 and the patterned sacrificial oxide layer 43A as an etch barrier, thereby forming a first recess 45A. The etching process of forming the first recess 45A may be performed in a high-density plasma etching apparatus using an etch gas containing a large amount of HBr (e.g., a flow rate ranging from about 150 sccm to about 200 sccm) and a small amount of $SF_6/Cl_2/O_2$.

Since the first recess 45A provides a basis of a neck pattern of a bulb type recess 45 (see FIG. 4D), the first recess 45A may have a vertical profile. The etching process for forming the first recess 45A is performed using a gas containing the etch gas ($HBr/SF_6/Cl_2/O_2$) and $N_2$ gas. At this point, a ratio of the etch gas flow rate to the $N_2$ gas flow rate is 1:1 or more. That is, the $N_2$ gas flow rate is greater than or equal to the etch gas flow rate. Details of forming the first recess 45A in the vertical profile will be described with reference to FIG. 6 later. Under this etch condition, the first recess 45A has a vertical profile and has a thickness ranging from about 100 Å to about 200 Å.

Figure 4C:
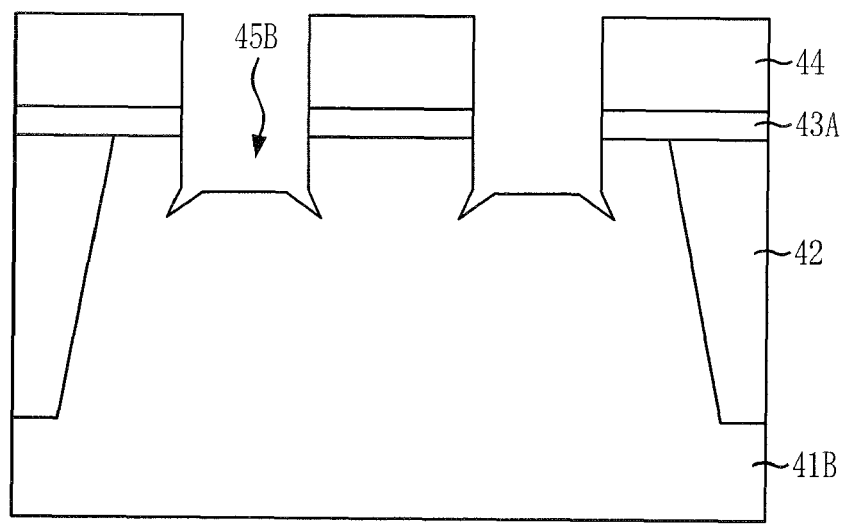

Referring to FIG. 4C, an additional etching process is performed such that the first recess 45A has a micro trench shape. The additional etching process may be performed in-situ in the same chamber where the aforementioned etching process for forming the first recess 45A is performed. In general, a plasma etching process includes a chemical etching process and a physical etching process. The micro trench is formed by the physical etching process during the plasma etching process. Specifically, the micro trench is formed when ions formed within the plasma are accelerated due to their orientation and collided with an etch layer. During the etching process, an edge of the trench is further etched. The etching process of forming the micro trench may be performed under give power and pressure in the high-density plasma etching apparatus using a mixture of etch gas and inert gas. Details of the etching conditions for forming the micro trench will be described with reference to FIGS. 7A to 7C later.

In order for the first recess 45A to have the micro trench shape, the etching process is performed at a power ranging from about 800 W to about 1200 W using the mixed gas of an etch gas containing a large amount of HBr and $SF_6/Cl_2$ and Ar as inert gas. At this point, an Ar amount is less than about 4% of the mixed gas amount.

Under the above etch conditions, the first recess 45A has the micro trench shape obtained by further etching the edges of the first recess 45A. Therefore, the lower portion of the first recess 45A is widened and the area to be etched is widened during formation of a subsequent recess. Reference numerals 45B and 41B represent a second recess (i.e., the first trench with the micro trench) and a second patterned substrate, each formed after the above-described additional etching process.

Figure 4D:
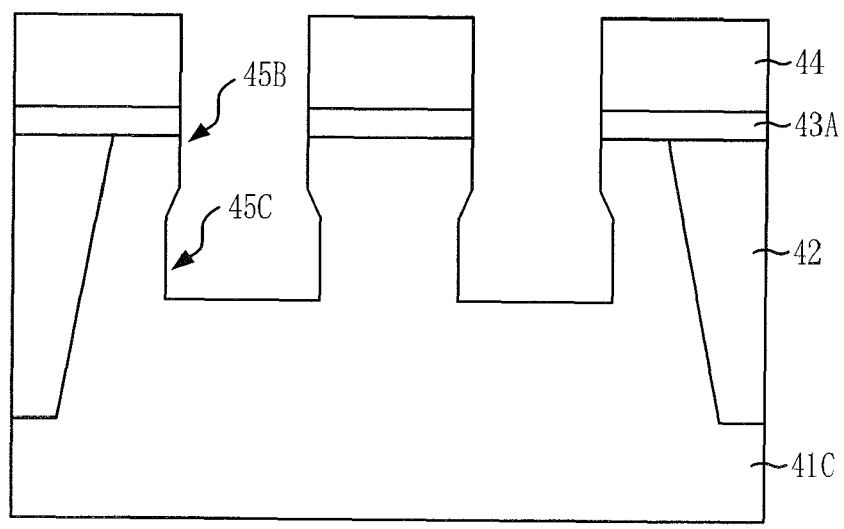

Referring to FIG. 4D, the second patterned substrate 41B disposed under the first recess 45B is etched using the hard mask pattern 44, which remains after the formation of the second recess 45B, as an etch barrier to form a third recess 45C having a width larger than a top portion of the second recess 45B having the vertical profile. This result is provided because the lower portion of the second recess 45B is widened by the process of forming the micro trench. Reference numeral 41C represents a third patterned substrate.

Figure 4E:
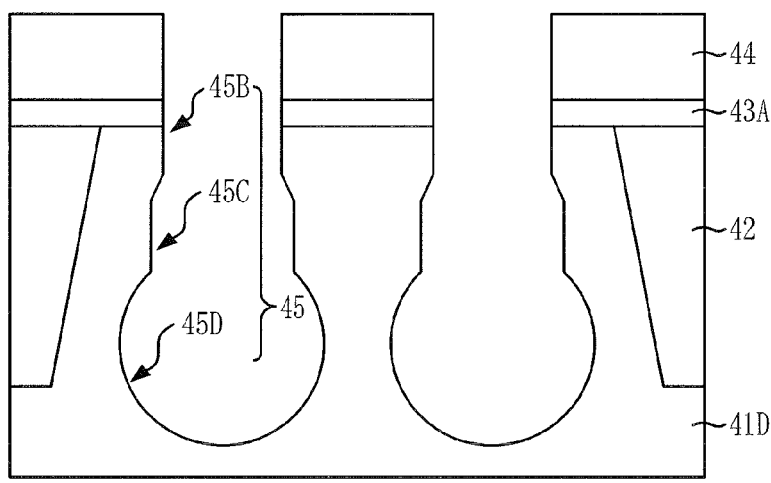

Like the top portion of the second recess 45B, the third recess 45C is a part of the neck pattern of the bulb type recess 45 (see FIG. 4E). That is, unlike the neck pattern of the typical recess, the neck pattern has the lower portion thicker than the upper portion due to the two-step etching process, that is, the etching process for forming the second recess 45B and the etching process for forming the third recess 45C. Since the upper portion of the neck pattern formed by the etching process of the first recess 45A constantly maintains its size, the overlay margin with respect to the gate pattern can be maintained. In addition, since the size of the lower portion of the neck pattern formed by the etching process for forming the third recess 45C increases, the size of the void can be reduced.

The third recess 45C has the vertical profile. Specifically, the third recess 45C is a region that will contact a bulb pattern formed by a subsequent process of forming a fourth recess 45D. If the area of the contacting region is reduced by the slope of the third recess 45C, it may be difficult to obtain a decrease in the size of the void. Therefore, increasing the slope of the profile towards verticalness is considered important.

The etching process for forming the third recess 45C is performed in a high-density plasma etching apparatus using a mixture of an $N_2$ gas and an etch gas containing a large amount of HBr (e.g., a flow rate ranging from about 150 sccm to 200 sccm) and a small amount of $SF_6/Cl_2/O_2$. At this point, a ratio of the etch gas flow rate to the $N_2$ gas flow rate is 1:1 or more. That is, the $N_2$ gas flow rate is greater than or equal to the etch gas flow rate. As the $N_2$ gas flow rate increases, the third recess 45C can advantageously have the vertical profile (see FIG. 6). As described above, the second recess 45B and the third recess 45C form the neck pattern of the bulb type recess 45, which includes the second recess 45B, the third recess 45C and the fourth recess 45D in accordance with the present embodiment.

Referring to FIG. 4E, the aforementioned fourth recess 45D having a spherical profile is formed by etching the third patterned substrate 41C disposed under the third recess 45C using the hard mask pattern 44, which remains after the etching of the third recess 45C, as an etch barrier. Specifically, spacer insulating layers (not shown) are formed on both sidewalls of the neck pattern including the second and third recesses 45B and 45C. Then, the fourth recess 45D is formed by isotropically etching a lower portion of the third recess 45C using the spacer insulating layers and the remaining hard mask pattern 44 as an etch barrier. The fourth recess 45D form a bulb pattern of the bulb type recess 45. Reference numeral 41D represents a fourth patterned substrate.

Through theses processes, the bulb type recess 45 is formed which includes the neck pattern and the bulb pattern, the neck pattern having the second and third recesses 45B and 45C, the bulb pattern having the fourth recess 45D.

Although it is not shown, the remaining hard mask pattern 44 and the patterned sacrificial oxide layer 43A are subsequently removed. Then, a portion of gate pattern is filled in the bulb type recess 45 and another portion of the gate pattern protrudes over the resultant substrate structure obtained after removing the hard mask pattern 44 and the patterned sacrificial oxide layer 43A. The gate pattern may include a stacked structure of a polysilicon electrode, a metal electrode, and a gate hard mask.

Figure 5:
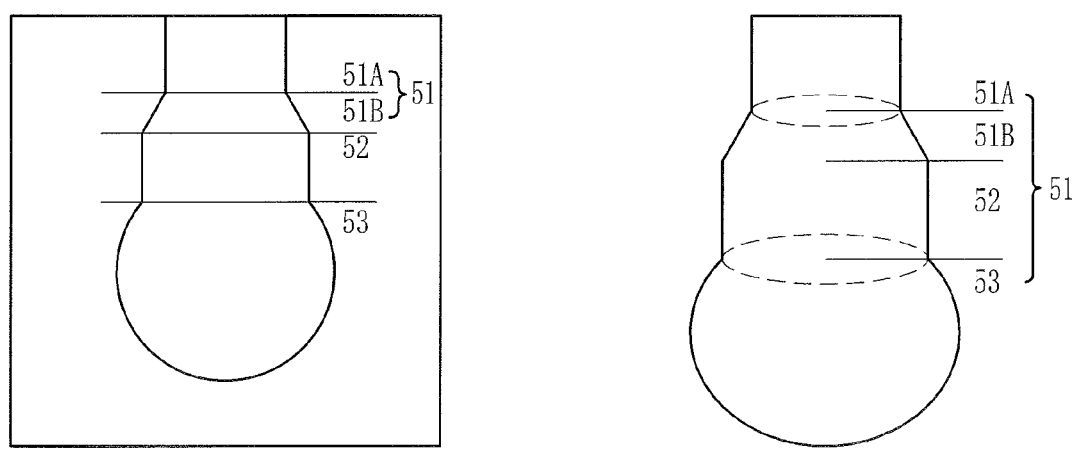
FIG. 5 illustrates a sectional view and a perspective view of a semiconductor device with a bulb type recess in accordance with an embodiment of the present invention.

FIG. 5 illustrates a sectional view and a perspective view of a semiconductor device with a bulb type recess in accordance with an embodiment of the present invention. A bulb type recess R includes a first recess 51, a second recess 52, and a third recess 53. An upper sidewall portion of the first recess 51 (i.e., upper first recess 51A) has a profile substantially vertical. The second recess 52 extends from a lower portion of the first recess 51 (i.e., lower first recess 51B) such that the second recess 52 has a width greater than the upper first recess 51A. The second recess 52 has a profile substantially vertical. The third recess 53 extends from a lower portion of the second recess 52, and has a spherical profile having a width greater than the second recess 52. The first recess 51 and the second recess 52 form the neck pattern of the bulb type recess R, and the third recess 53 forms the bulb pattern of the bulb type recess R.

The lower first recess 51B is a region where the lower portion of the first recess 51 is expanded due to the micro trench formed in the first recess 51. Therefore, the second recess 52 can have a width greater than the first recess 51, more specifically, the upper first recess 51A.

An overlay margin with respect to a gate pattern can be maintained because the width of the first recess 51 corresponding to the upper portion of the neck pattern is maintained narrowly. The size of the void can be reduced because the width of the second recess 52 corresponding to the lower portion of the neck pattern is greater than that of the first recess 51.

Although not illustrated, a gate pattern is formed over the bulb type recess R. Specifically, a polysilicon electrode is filled into the bulb type recess R. Then, a metal electrode and a gate hard mask are sequentially formed on the polysilicon electrode, thereby forming the gate pattern.

Figure 6:
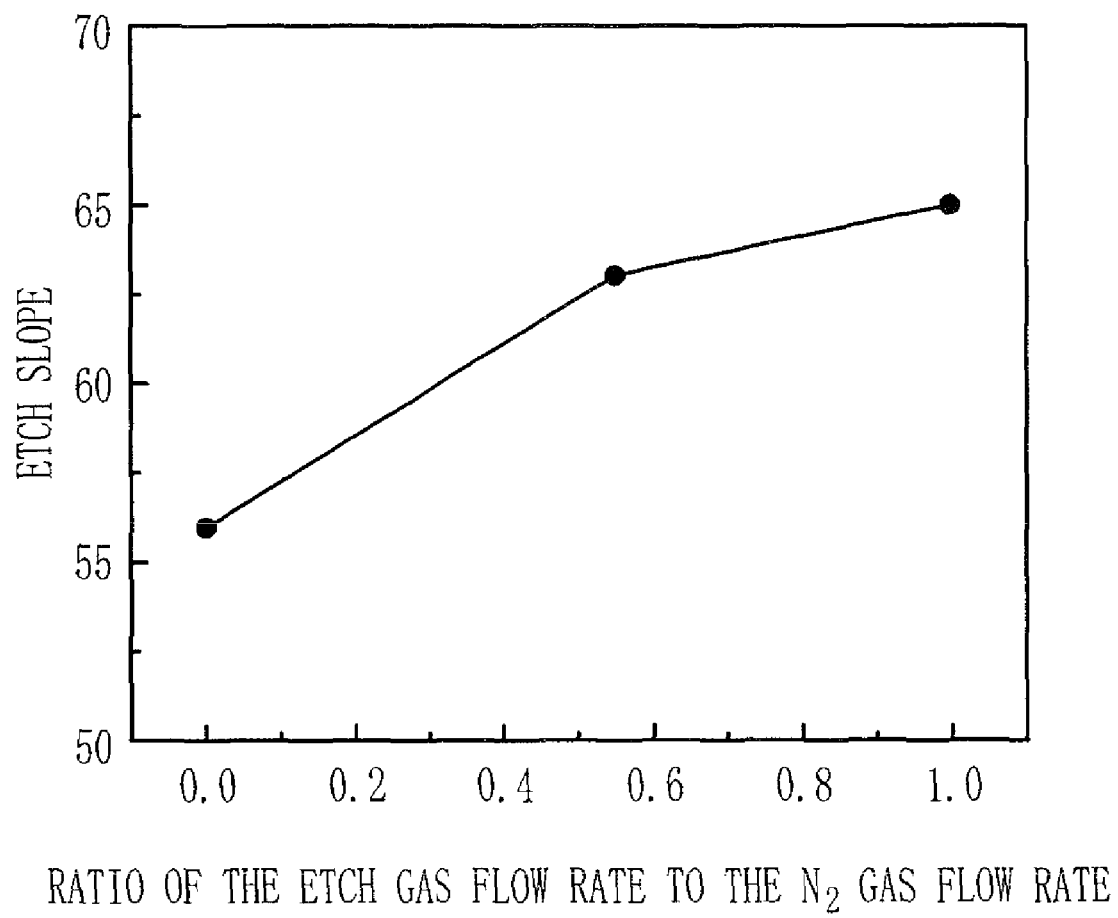
FIG. 6 illustrates a graph of an etch slope of a semiconductor substrate with respect to a ratio of an etch gas flow rate to an $N_2$ gas flow rate in accordance with an embodiment of the present invention.

FIG. 6 illustrates a graph of an etch slope of a semiconductor substrate with respect to a ratio of an etch gas flow rate to the $N_2$ gas flow rate in accordance with an embodiment of the present invention. In the present embodiment, the etch gas is a gas mixture including HBr, $SF_6$, $Cl_2$, and $O_2$ gases. It can be seen from FIG. 6 that as the $N_2$ gas flow rate increases compared with the etch gas flow rate, the etch slope is closer to about 90°. Therefore, as the $N_2$ gas flow rate increases, the first recess 45A (see FIG. 4B) can advantageously have the vertical profile. As mentioned above, under this etch condition, the first recess 45A has a vertical profile and has a thickness ranging from about 100 Å to about 200 Å.

Figure 7A:
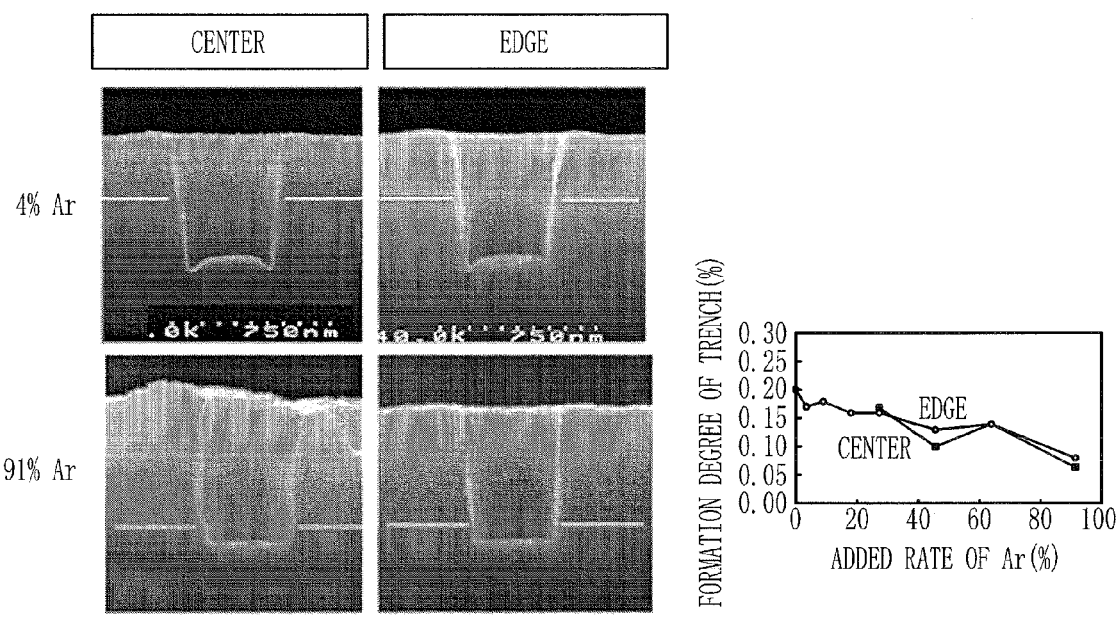
FIGS. 7A to 7C are micrographs illustrating conditions for forming a micro trench in accordance with an embodiment of the present invention.
Figure 7B:
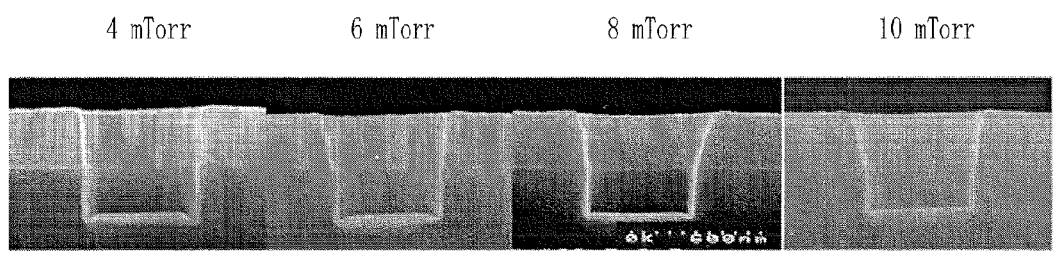
Figure 7C:
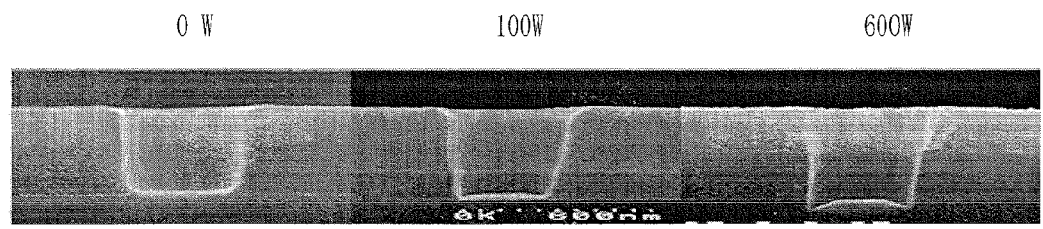

FIGS. 7A to 7C illustrate micrographs provided to show conditions for forming a micro trench. FIG. 7A illustrates the formation degree of the micro trench according to an amount of Ar when Ar is used as inert gas in the mixed gas. When Ar is about 4% of the mixed gas, the center and edge of the trench are further etched. On the other hand, when Ar is about 91% of the mixed gas, no micro trench is observed (see the left side of FIG. 7A). Therefore, as the amount of Ar increases, the rate of the formation of the micro trench is lowered (see the right side of FIG. 7A).

FIG. 7B illustrates the effect of the pressure on the formation of the micro trench. As the pressure increases from about 4 mtorr to 6 mtorr, 8 mtorr and 10 mtorr, the shape of the micro trench becomes obscure. This result is because ions are gathered in the sidewall edges due to the increase in the mean free path of gas particles when the pressure is reduced. Therefore, as the pressure decreases, the formation degree of the micro trench increases.

FIG. 7C illustrates the effect of the power on the formation of the micro trench. As the power increases from about 0 W to 100 W and 500 W, the shape of the micro trench becomes clear. When the power increase, the reflection probability of ions with respect to the sidewalls increases and the reflection flow of the ions increases. Therefore, the collision of the ions against the sidewall edges is more likely to occur. As a result, as the power increases, the formation degree of the micro trench increases.

In accordance with the embodiments of the present invention, the size of the bulb pattern and the overlay margin with respect to the gate pattern formed over the recess can be maintained in forming the neck pattern having the dual shape, thereby reducing the size of the void and improving the electrical characteristics of the device.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   etching a substrate to form a first recess having a micro trench;
   etching the substrate disposed under the first recess to form a second recess having a profile substantially vertical and a width greater than a portion of the first recess where no micro trench is formed;
   etching the substrate disposed under the second recess to form a third recess having a width greater than the second recess and a profile substantially spherical; and
   forming a gate pattern in a resultant recess comprising the first to third recesses.

2. The method of claim 1, wherein the forming of the first recess comprises:
   etching the substrate to form the first recess having a profile substantially vertical; and
   forming a micro trench at a lower edge portion of the first recess.

3. The method of claim 2, wherein the forming of the first recess comprises using a mixed gas of $N_2$ gas and an etch gas containing HBr and $SF_6/Cl_2/O_2$.

4. The method of claim 3, wherein a flow rate of the $N_2$ gas is greater than or equal to that of the etch gas.

5. The method of claim 2, wherein the forming of the micro trench comprises using a mixed gas of Ar gas and an etch gas containing HBr and $SF_6/Cl_2$.

6. The method of claim 5, wherein the Ar gas has an amount less than about 4% of the amount of the mixed gas.

7. The method of claim 2, wherein the forming of the micro trench comprises using a power ranging from about 800 W to about 1200 W.

8. The method of claim 1, wherein the forming of the second recess comprises using a mixed gas of $N_2$ gas and an etch gas containing HBr and $SF_6/Cl_2/O_2$.

9. The method of claim 8, wherein a flow rate of the $N_2$ gas is greater than or equal to that of the etch gas.

10. The method of claim 1, wherein the forming of the third recess is performed in a high-density plasma etching apparatus.

11. The method of claim 10, wherein the high-density plasma etching apparatus is configured to use a mixture of $N_2$ gas and an etching gas containing HBr and $SF_6/Cl_2/O_2$.

12. A semiconductor device, comprising:
   a first recess having a substantially vertical profile at an upper sidewall portion;
   a second recess extending from a lower portion of the first recess and having a width greater than the first recess and a profile substantially vertical at a sidewall portion;
   a third recess extending from a lower portion of the second recess and having a width greater than the second recess and a profile substantially spherical; and
   a gate pattern filled in the first to third recesses.

13. The semiconductor device of claim 12, wherein the first recess comprises a micro trench at a lower edge portion.

14. The semiconductor device of claim 12, wherein the gate pattern comprises a conductive layer for forming a gate electrode.

15. The semiconductor device of claim 14, wherein the conductive layer includes polysilicon.

16. The semiconductor device of claim 12, wherein the third recess has a substantially spherical configuration.

* * * * *